(12) United States Patent
Iizuka

(10) Patent No.: US 9,478,477 B2
(45) Date of Patent: Oct. 25, 2016

(54) SEMICONDUCTOR DEVICE

(71) Applicant: FUJI ELECTRIC CO., LTD., Kawasaki-shi (JP)

(72) Inventor: Yuji Iizuka, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/330,509

(22) Filed: Jul. 14, 2014

(65) Prior Publication Data
US 2015/0061109 A1  Mar. 5, 2015

(30) Foreign Application Priority Data

Aug. 30, 2013 (JP) ................. 2013-180021

(51) Int. Cl.
| | |
|---|---|
| *H01L 23/34* | (2006.01) |
| *H01L 23/367* | (2006.01) |
| *H01L 23/40* | (2006.01) |
| *H01L 23/00* | (2006.01) |
| *H01L 23/31* | (2006.01) |
| *H01L 23/373* | (2006.01) |
| *H01L 23/467* | (2006.01) |
| *H01L 23/473* | (2006.01) |
| *H01L 23/498* | (2006.01) |

(52) U.S. Cl.
CPC ......... *H01L 23/367* (2013.01); *H01L 23/3121* (2013.01); *H01L 23/4006* (2013.01); *H01L 24/00* (2013.01); *H01L 23/3735* (2013.01); *H01L 23/467* (2013.01); *H01L 23/473* (2013.01); *H01L 23/49833* (2013.01); *H01L 23/49844* (2013.01); *H01L 2224/0823* (2013.01); *H01L 2924/1305* (2013.01); *H01L 2924/13055* (2013.01); *H01L 2924/13091* (2013.01)

(58) Field of Classification Search
CPC . H01L 25/11; H01L 23/367; H01L 23/3157; H01L 23/34; H01L 23/4338; H02M 7/003
USPC ........ 257/685, 693, 712–722, E25.027, 700; 316/704, 720, 760–767; 361/704; 165/80.2, 80.4, 104, 33
See application file for complete search history.

(56) References Cited

U.S. PATENT DOCUMENTS

| | | | |
|---|---|---|---|
| 8,514,579 B2* | 8/2013 | Stolze et al. .................. 361/728 |
| 8,648,461 B2* | 2/2014 | Seki .............................. 257/713 |
| 2003/0168729 A1* | 9/2003 | Ishiwata ................. H01L 23/34 257/700 |
| 2004/0207986 A1* | 10/2004 | Rubenstein ......... H01L 23/4338 361/704 |
| 2007/0145574 A1* | 6/2007 | Colbert et al. ................ 257/721 |

(Continued)

FOREIGN PATENT DOCUMENTS

| | | |
|---|---|---|
| JP | 2003-243611 A | 8/2003 |
| JP | 2007-194442 A | 8/2007 |
| JP | 2011-142124 A | 7/2011 |

*Primary Examiner* — Kenneth Parker
*Assistant Examiner* — Young W Kim
(74) *Attorney, Agent, or Firm* — Rossi, Kimms & McDowell LLP

(57) ABSTRACT

A semiconductor device includes a semiconductor element having a semiconductor chip and connection terminals, a cooling fin to which the semiconductor element is fixed, and an external cooling body having a passage for cooling medium, the cooling fin being fixed to the external cooling body. The semiconductor element has a protruding cooling block that is inserted and fixed to the cooling fin, which in turn is fixed to the external cooling body such that the cooling fin is in contact with the cooling medium.

10 Claims, 2 Drawing Sheets

(56) References Cited

U.S. PATENT DOCUMENTS

2010/0188814 A1* 7/2010 Nakatsu et al. .............. 361/689

2013/0075886 A1* 3/2013 Abe ...................... H02M 7/003
                                                    257/685

* cited by examiner

SEMICONDUCTOR DEVICE

CROSS-REFERENCE TO RELATED APPLICATION

This application is based on, and claims priority to, Japanese Patent Application No. 2013-180021, filed on Aug. 30, 2013, contents of which are incorporated herein by reference.

BACKGROUND OF THE INVENTION

1. Field of the Invention

Embodiments of the present invention relate to semiconductor devices such as power devices and switching ICs for high frequency application, and in particular, to semiconductor devices in power semiconductor elements.

2. Description of the Background

Power devices are used for switching devices in power converter applications. A conventional power device is disclosed in Japanese Unexamined Patent Application Publication No. 2007-194442 ("JP 2007-194442"), for example. FIG. 3 shows a construction of the power device. The power device comprises: a heat sink 101 made of a good thermal conductivity material composed of a base plate 101a and a cooling fin 101b; an insulating substrate 103, mounting a semiconductor chip 102, fixed on the base plate 101a; and a resin casing 104 surrounding the semiconductor chip 102 and the insulating substrate 103. The power device is formed in a form of a monolithic module. Electrical connection is held between the surface electrodes of the semiconductor chips 102 and the circuit pattern 106 on the insulating substrate 103 usually by joining them with aluminum wires 105.

Japanese Unexamined Patent Application Publication No. 2011-142124 ("JP 2011-142124") proposes a semiconductor device in which a plurality of units of a semiconductor module is accommodated in a bolted unit with elastic adhesive, and the bolted unit is mounted on a cooling body.

In the conventional example disclosed in JP 2007-194442, the power semiconductor devices are used in power conversion devices such as inverters. In order to construct a full bridge circuit, for example, the terminals 108 projecting out upward through the lid 107 for enclosing the top of the resin casing 104 shown in FIG. 3 are connected with wiring means such as a substrate or bus bars to carry out wiring between discrete semiconductor devices. In addition, external connection to an output side and an input side, or power supply side, are also necessarily conducted.

A required external configuration of the semiconductor device is determined by constraints of these conditions and the overall external configuration of the device. Corresponding to the application field of the semiconductor device, the number of the insulating substrates 103 in the internal structure of the semiconductor device and the connection between the insulating substrates are determined according to the configuration.

To meet increased demand for power conversion devices in recent years, and to take advantage of improved performance of semiconductor chips, each class of semiconductor devices corresponding to the demands for specific ratings are assembled plentifully. This assembly needs preparation for each of the semiconductor chips 102, insulating substrates 103, resin casings 104, lids 107 and terminals 108, corresponding to each necessary capacity.

On this background, there are numerous types of the external configuration of the insulating substrate 103 and the interconnection between the insulating substrates 103 on the heat sink 101. This increases the number of types of required tools necessary for production. Moreover, the demanded types of semiconductor devices are changing rapidly, which shortens the effectively employed period of production equipment and tools.

These situations hinder cost reduction and, in addition, lower efficiency in mass-production due to instability of quality. It is becoming difficult to provide the semiconductor devices in inexpensive prices.

SUMMARY OF THE INVENTION

Embodiments of the present invention provide a semiconductor device in which a basic construction of semiconductor devices is made common to improve production efficiency. The semiconductor device is inexpensive and easily applied to a variety of devices.

A first aspect of the present invention is a semiconductor device comprising: a semiconductor element having a semiconductor chip(s) and connection terminals; a cooling fin to which the semiconductor element is fixed; an external cooling body having a passage for cooling medium, the cooling fin being fixed to the external cooling body; wherein the semiconductor element has a protruding cooling block that is inserted and fixed to the cooling fin; and the cooling fin is fixed to the external cooling body such that the cooling fin is in contact with the cooling medium.

A second aspect of the present invention is the semiconductor device of the first aspect of the invention, wherein the semiconductor element is fixed to the cooling fin by screw-fitting a male screw formed on the cooling block to a female screw formed on the cooling fin.

A third aspect of the present invention is the semiconductor device of the first aspect of the invention, wherein the cooling fin is fixed to the external cooling body by screw-fitting a male screw formed on a peripheral surface of the cooling fin to a female screw formed in the external cooling body.

A fourth aspect of the present invention is the semiconductor device of the first aspect of the invention, wherein a plurality of the semiconductor elements are fixed to the external cooling body.

A fifth aspect of the present invention is the semiconductor device of the fourth aspect of the invention, further comprising an externally connecting terminal that connects the connection terminals of the plurality of semiconductor elements and constructs a semiconductor circuit.

A sixth aspect of the present invention is the semiconductor device of the first aspect of the invention, wherein the semiconductor element is formed by sealing the semiconductor chip with a sealing resin.

A seventh aspect of the present invention is the semiconductor device of the sixth aspect of the invention, wherein a part of a surface of the sealing resin of the semiconductor element is covered with a surface protection film formed of a material selected from the group consisting of $Al_2O_3$, AlN, $Si_3N_4$, $SiO_2$, and BN, and a part of a side surface of the sealing resin has unevenness for securing a creeping distance of insulation.

Embodiments of the present invention allow common basic construction of a semiconductor device. According to a required rating, an appropriate combination can be made and a cooling fin is monolithically combined, thereby achieving a construction suited for a variety of needs. Therefore, production efficiency is improved, and provided semiconductor devices according to the invention are inexpensive and easily applied to various devices. Cooling performance is also improved.

DETAILED DESCRIPTION OF THE ILLUSTRATED EMBODIMENTS

An embodiment of the present invention will be described in detail in the following with reference to the accompanying drawings.

Figure 1:
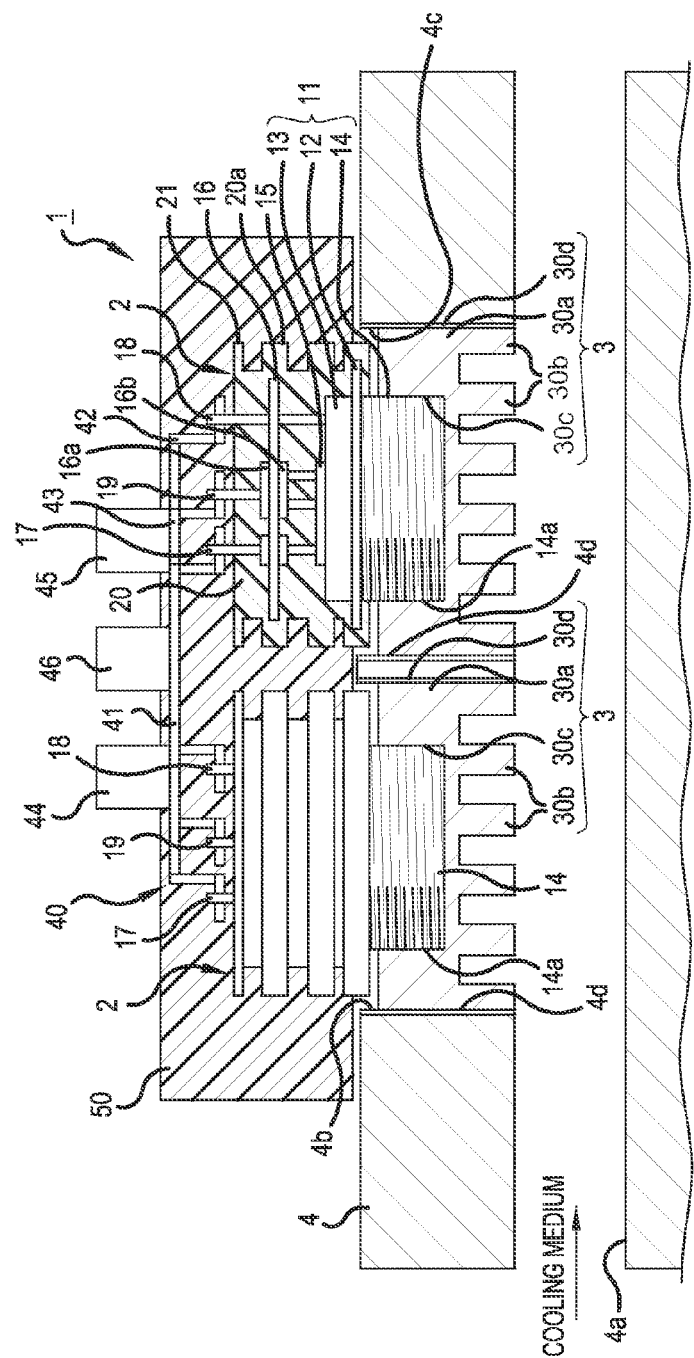
FIG. 1 is a sectional view of a semiconductor device according to an embodiment of the present invention.
Figure 2:
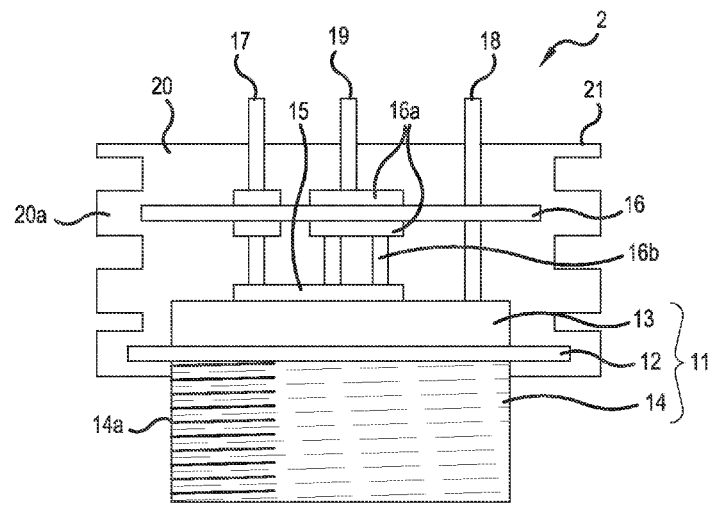
FIG. 2 is an enlarged sectional view of a semiconductor element in the semiconductor device of FIG. 1.

FIG. 1 is a sectional view of a whole semiconductor device according to an embodiment of the present invention, and FIG. 2 is an enlarged sectional view of a semiconductor element in the semiconductor device of FIG. 1.

Referring to FIG. 1, a semiconductor device 1 comprises a semiconductor element 2, a cooling fin 3 fixing and supporting the semiconductor element 2, and an external cooling body 4 having one or more cooling fins 3.

Semiconductor element 2 has a base substrate 11, as shown in FIG. 2. The base substrate 11 includes an insulating substrate 12, which may be made of a ceramic material of high thermal conductivity, a circuit pattern plate 13, which may be made of a relatively thick metallic material, such as a copper plate, and be disposed on upper surface of the insulating substrate 12, and a cooling block 14, which may be made of a metallic material, such as copper, and disposed on the lower surface of the insulating substrate 12.

A semiconductor chip 15 is mounted on the circuit pattern plate 13. The semiconductor chip 15 may be a power semiconductor switching element such as an insulated gate bipolar transistor (IGBT) or a power metal oxide semiconductor field effect transistor (power MOSFET).

The cooling block 14 is formed in a circular cylinder with a diameter larger than a height and has a male screw 14a formed on the outer peripheral surface by machining.

Above the circuit pattern plate 13, a printed circuit board 16 is disposed with a predetermined gap, and the printed circuit board 16 has a circuit pattern 16a for electrical connection in the semiconductor element 2. The printed circuit board 16 also has post electrodes 16b, which may be in direct contact with the electrodes formed on the upper surface of the semiconductor chip 15. A connecting terminal 17 is connected to an electrode on the semiconductor chip 15; a connecting terminal 18 is connected to the circuit pattern plate 13; and a connecting terminal 19 projects upward from the printed circuit board 16.

The base substrate 11, the semiconductor chip 15, and the printed circuit board 16 are covered with a sealing resin 20 of a thermosetting resin material such as an epoxy resin. The sealing resin 20 covers the outer periphery of the insulating substrate 12 and extends upward, and has unevenness 20a formed on the outer peripheral surface thereof for securing a sufficient creeping distance of insulation under a dimensional restriction. A surface protecting film 21, which may be formed of an inorganic material such as $Al_2O_3$, AlN, $Si_3N_4$, $SiO_2$, and BN, is disposed on the outer peripheral surface of the sealing resin 20.

Thus, the semiconductor element 2 having a semiconductor chip 15 is constructed.

The cooling fin 3 has a diameter larger than the height, and includes a cylindrical body 30a having a diameter thereof greater than the outer diameter of the sealing resin 20 of the semiconductor element 2. A fin portion 30b is formed on the lower surface of the cylindrical body 30a. In the upper part of the cylindrical body 30a, a female screw 30c is formed at the central position. A female screw 30c screw-fits with a male screw 14a formed on the cooling block 14 of the semiconductor element 2. The cylindrical body 30a has a male screw 30d formed on the outer peripheral surface thereof.

The effective screw length of the female screw 30c of the cooling fin 3 is determined so that when the female screw 30c is screw-fitted to the male screw 14a and the male screw 14a has reached the bottom of the effective screw of the female screw 30c, the lower surface of the insulating substrate 12 is at a position apart from the upper surface of the cooling fin 3 by a predetermined distance.

Thus, the semiconductor element 2 is fastened so that the bottom surface of the sealing resin 20 is positioned with a predetermined distance from the top surface of the cooling fin 3.

The external cooling body 4, as shown in FIG. 1, has a rectangular parallelepiped shape and includes a cooling medium passage 4a formed along the longitudinal direction at the place in the center in the vertical direction and in the center in the width direction of the external cooling body 4. The external cooling body 4 has through-holes 4b and 4c bored from the top surface thereof and reaching the cooling medium passage 4a with a predetermined distance between the through-holes in the longitudinal direction. A female screw 4d is formed on the inner circumferential surface of the through-holes 4b and 4c, and screw-fitted to the male screw 30d formed on the cooling fin 3.

The depth of the through-holes 4b and 4c is larger than the height of the cylindrical body 30a of the cooling fin 3 and determined so that the lower surface of the insulating substrate 12 of the semiconductor element 2 is approximately coplanar with the upper surface of the external cooling body 4. The cooling medium can be cooling gas such as air, cooling liquid such as water, or any other coolant.

Two sets of the cooling fin 3 and the semiconductor element 2 held on the cooling fin 3 are prepared and screw-fitted to the female screws 4d formed on the through-holes 4b and 4c in the external cooling body 4, as shown in FIG. 1. The two sets are inserted until such a position that the lower surface of the cooling fin 3 is disposed coplanar with, or a little lower than, the lower surface of the external cooling body 4, and the fin portion 30b faces to the cooling medium passage 4a.

Then, position adjustment may be performed for the connection terminals 17, 18, and 19 projecting out of the two semiconductor elements 2 to be arranged in a straight line. An externally connecting terminal 40 connects the connection terminals 17, 18, and 19 using, for example, soldering or welding to form a desired semiconductor circuit. The externally connecting terminal 40 includes connecting plates 41, 42, and 43, which may be made of bus bars connecting individually the connection terminals 17, 18, and 19, and external terminals 44, 45, and 46 connected to the connecting plates 41, 42, and 43.

Thus, a semiconductor device 1 of a semiconductor module in a two-in-one type performing a cooling function is constructed after covering the configuration having the connection terminals 17, 18, and 19 connected by the externally connecting terminals 40 by an external casing 50, which may be made of an insulating resin material.

In the embodiment described above, one or more semiconductor elements 2 having a semiconductor chip 15 and a protruding cooling block 14 are held on cooling fins 3, which in turn are fixed in an external cooling body 4 in a configuration with the cooling fins 3 in contact with a cooling medium. Consequently, the semiconductor elements 2 and the cooling fins 3 are commonly used for easily producing a semiconductor device 1 having a construction suited for a variety of needs, and production efficiency has been improved.

The heat generated in the semiconductor chip 15 is transmitted through the cooling block 14 and cooling fin 3 directly to the cooling medium, performing efficient cooling effect. A large capacity semiconductor device 1 can be easily obtained by integrating the discrete semiconductor elements 2 in an external cooling body 4.

And the cooling block 14 of the semiconductor element 2 and the cooling fin 3 are joined by screw-fitting and the cooling fin 3 and the external cooling body 4 are also joined by screw-fitting, the contact area between these components are relatively large and high heat transfer rate is achieved, which enables the semiconductor chips 15 to be efficiently and stably cooled. In addition, fitting operation of the semiconductor element 2 to the cooling fin 3 and fitting operation of the cooling fin 3 into the external cooling body 4 can be carried out without using any tool and readily only by screw-fitting the male screw 14*a* to the female screw 30*c* and screw-fitting the male screw 30*d* to the female screw 4*d*.

A combined configuration of the plurality of semiconductor elements 2 held on the external cooling body 4 through the cooling fins 3 is covered by the outer casing 50, which avoids rotation of the semiconductor elements 2 and the cooling fins 3 surely preventing the semiconductor elements 2 and the cooling fins 3 from becoming loose.

Figure 3:
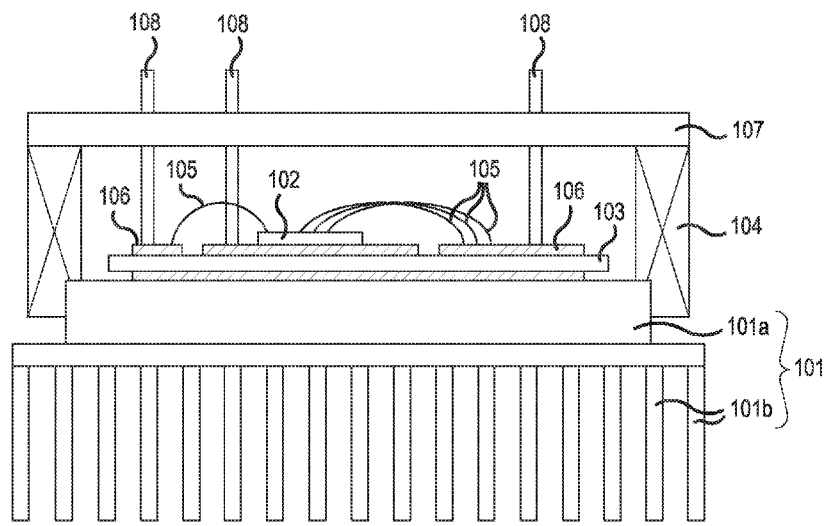
FIG. 3 is a sectional view of an example of conventional semiconductor device.

In the case of the conventional example described earlier and shown in FIG. 3, the insulating substrate 103 mounting the semiconductor chip 102 is joined directly to the base plate 101*a* of the heat sink 101 by means of soldering, for example. Thus, a certain jig or a tool is necessary for positioning. Because a piece of solder material has to be interposed between the heat radiation member and the base plate 101*a*, direct contact between the heat radiation member and the base plate 101*a* is impossible, and a plurality of insulating substrates 103 cannot be joined to the base plate 101*a* with ensured flatness.

In contrast, in the embodiment of the invention, the semiconductor element 2 is screw-fitted to the cooling fin 3, which in turn is screw-fitted to the external cooling body 4. Thus, no jig or tool is needed for positioning, and a monolithic semiconductor device is constructed in combination of a plurality of semiconductor elements 2.

In the above description, the semiconductor chip 15 and the connection terminals 17, 18, and 19 are connected through the post electrodes 16*b* and the printed circuit board 16. However, the present invention is not limited to this construction but a semiconductor element having a joining structure using aluminum wires as in the conventional example can be used for constructing a semiconductor device according to the present invention, as long as the semiconductor element has a protruding cooling block.

In the above-described embodiment, the semiconductor element 2 comprises a base substrate 11 including the insulating substrate 12. However, the present invention is not limited to this construction, but a non-insulated semiconductor element of a stud type without the insulating substrate 12 can be fitted to the cooling fin 3 as long as the semiconductor element 2 has a protruding cooling block.

In the above-described embodiment, the protruding cooling block 14 is screw-fitted to the cooling fin 3. However, the present invention is not limited to this construction, but the cooling block 14 is inserted into a through-hole bored in the cooling fin 3 and fitted, or joined by soldering with a hard solder, for example, to interlock together.

The cooling fin 3 and the external cooling body 4 can be combined not only by screw-fitting but also by inserting and fitting the cooling fin 3 into the external cooling body 4 or joining by means of hard solder joining to interlock together.

In the above-described embodiment, the cooling block 14 and the cooling fin 3 have a cylindrical shape for screw-fitting to the cooling fin 3 and the external cooling body 4, respectively. However, when the component is inserted and fitted to a through-hole to interlock together, the cooling block 14 and the cooling fin 3 can have a configuration other than the cylindrical shape, for example, a square column or a prism.

In the above-described embodiment, two semiconductor elements 2 are mounted on an external cooling body 4. However, the present invention is not limited to the construction, as three or more semiconductor elements can be mounted on a cooling body 4 by boring the number of through-holes corresponding to the number of the semiconductor elements and female screws 4*d* are formed on the inner circumference of the through-holes.

In the above-described embodiment, the semiconductor element 2 has one semiconductor chip that is a switching element. However, the present invention is not limited to the construction, but two or more semiconductor chips can be mounted on the base substrate 11.

What is claimed is:

1. A semiconductor device comprising:
   a semiconductor element comprising a semiconductor chip, connection terminals, and a cooling block;
   a cooling fin to which the semiconductor element is fixed; and
   an external cooling body comprising a passage for a cooling medium, the cooling fin being fixed to the external cooling body,
   wherein the cooling block extends into, and is fixed to, the cooling fin such that a lower surface of the cooling block is disposed lower than an upper surface of the cooling fin;
   wherein the cooling fin is fixed to the external cooling body such that the cooling fin is exposed to the passage; and
   wherein the semiconductor element is fixed to the cooling fin by screw-fitting a male screw on the cooling block to a female screw on the cooling fin, one male screw being provided for one semiconductor element, and a width of the male screw being greater than a width of the semiconductor chip.

2. The semiconductor device according to claim 1, wherein
   the cooling fin is fixed to the external cooling body by screw-fitting a male screw on the cooling fin to a female screw on the external cooling body.

3. The semiconductor device according to claim 1, wherein
   a plurality of the semiconductor elements are fixed to the external cooling body.

4. The semiconductor device according to claim 3, further comprising an externally connecting terminal that connects the connection terminals of the plurality of semiconductor elements.

5. The semiconductor device according to claim 1, further comprising a sealing resin sealing the semiconductor chip.

6. The semiconductor device according to claim 5, further comprising a surface protection film comprising a material selected from the group consisting of $Al_2O_3$, AlN, $Si_3N_4$, $SiO_2$, and BN, the surface protection film being disposed on the sealing resin, wherein at least a portion of a side surface of the sealing resin has unevenness.

7. The semiconductor device according to claim 1, wherein the cooling fin further includes a lower surface opposing the upper surface and having a fin portion, the upper surface has a hole, and the cooling block extends into the hole of the upper surface such that the male screw of the cooling block is coupled with the female screw of the hole of the upper surface.

8. The semiconductor device according to claim 7, wherein the cooling fin further includes a side surface connecting the lower surface and the upper surface, the side surface having a male screw.

9. The semiconductor device according to claim 8, wherein the external cooling body includes a hole, and the cooling fin is fixed to the external cooling body such that the male screw on the side surface of the cooling fin is coupled with a female screw on a sidewall of the hole of the external cooling body.

10. The semiconductor device according to claim 1, wherein the cooling fin includes an outer surface having a male screw, the external cooling body includes a hole, and the cooling fin is fixed to the external cooling body such that the male screw on the outer surface of the cooling fin is coupled with a female screw on a sidewall of the hole of the external cooling body.

\* \* \* \* \*